(12) United States Patent
Touchton et al.

(10) Patent No.: US 9,520,728 B2
(45) Date of Patent: Dec. 13, 2016

(54) DIAGNOSTIC CHARGING CRADLE AND METHODS OF USING THE SAME

(71) Applicants: Scott F. Touchton, Pottstown, PA (US); Daniel A. Morris, Downington, PA (US)

(72) Inventors: Scott F. Touchton, Pottstown, PA (US); Daniel A. Morris, Downington, PA (US)

(73) Assignee: PERIMETER TECHNOLOGIES, Reading, PA (US)

( * ) Notice: Subject to any disclaimer, the term of this patent is extended or adjusted under 35 U.S.C. 154(b) by 280 days.

(21) Appl. No.: 14/478,607

(22) Filed: Sep. 5, 2014

(65) Prior Publication Data

US 2016/0072324 A1 Mar. 10, 2016

(51) Int. Cl.
*H02J 7/00* (2006.01)
*A01K 15/02* (2006.01)

(52) U.S. Cl.
CPC .......... *H02J 7/0042* (2013.01); *A01K 15/023* (2013.01); *H02J 7/0052* (2013.01)

(58) Field of Classification Search
CPC ..................................................... H02J 7/0042
USPC .......................... 320/107, 115, 127, 128, 137
See application file for complete search history.

(56) References Cited

U.S. PATENT DOCUMENTS

| | | | | |
|---|---|---|---|---|
| 5,425,330 A | * | 6/1995 | Touchton | A01K 15/023 119/721 |
| 5,533,469 A | * | 7/1996 | Touchton | A01K 15/023 119/721 |
| 5,870,973 A | * | 2/1999 | Touchton | A01K 15/023 119/720 |
| 7,709,136 B2 | * | 5/2010 | Touchton | H01M 2/30 429/100 |
| 8,692,676 B2 | * | 4/2014 | Touchton | G08B 23/00 340/539.11 |

* cited by examiner

*Primary Examiner* — Richard V Muralidar
(74) *Attorney, Agent, or Firm* — Donald R. Piper, Jr.; Dann, Dorfman, Herrell and Skillman, P.C.

(57) ABSTRACT

A device and method for charging and testing an animal stimulus receiver is provided herein.

31 Claims, 9 Drawing Sheets

DIAGNOSTIC CHARGING CRADLE AND METHODS OF USING THE SAME

FIELD OF THE INVENTION

The present invention relates generally to devices and methods for charging and testing receivers and more particularly, but not exclusively, to devices and methods for charging and testing animal stimulus receivers.

BACKGROUND OF THE INVENTION

Animal movements are commonly controlled through the application of a corrective stimulus. For example, a receiver may be attached to an animal that is designed to produce a stimulus at the animal to correct the animal's movement or behavior upon the reception of a signal. Most receivers that are designed to apply corrective stimuli are wireless and rely on battery power for their operation. Accordingly, the batteries of such receivers require intermittent charging to maintain receiver operation.

However, in addition to battery charging, receivers that apply stimuli to animals must be tested to confirm their operation and that such receivers will continue to produce stimuli upon the reception of a signal. Because these receivers respond to a magnetic field with a unique signature and deliver a painful shock, users do not want to test the operation of the receiver on themselves. In current products throughout the industry, consumers simply replace or recharge a battery, place the receiver back on the animal and assume it is working.

Therefore, a need exists in the field for a charging station or cradle that both charges and tests the receiver to confirm the receiver's satisfactory operation.

SUMMARY OF THE INVENTION

A charger of the invention, which may be a cradle, may ensure that an animal stimulus receiver is fully operational. In one aspect, the present invention includes a cradle for charging and testing an animal stimulus receiver. The animal stimulus receiver may include a stimulus generator that may deliver a stimulus to an animal. The cradle of the invention may include a power supply connector, which may communicate with a power supply. The cradle may also include charging circuitry that may be in communication with the power supply connector that may also be configured to apply a charging voltage to the animal stimulus receiver. Additionally, the cradle may include stimulus detection circuitry configured to receive a stimulus from the animal stimulus receiver and determine a stimulus status of the animal stimulus receiver.

In an animal stimulus receiver, such as a dog collar receiver, that incorporates a rechargeable battery, charging may be accomplished using two connection points to the receiver. A ground connection may be supplied by one of the two correction probes or prongs. The foregoing probes normally deliver the stimulus (e.g., shock stimulus) to the animal. One of the probes is connected to the internal battery ground terminal, which is also the primary ground connection for all of the internal circuitry in the collar.

The other connection for charging may be made via a round pin that exits the side of the receiver case. This pin supplies an electrical connection to the internal charge controller circuitry, which handles the charging of the battery. To charge the receiver, about 5 volts may be applied to the pin while ground connection is made to the appropriate probe.

The receiver may incorporate a charging output indicator—a green LED may light up to indicate that charging is taking place. For example, maximum charge current may be about 150 mA and the green LED terminates when the battery charge current has dropped to about 25 mA.

A cradle of the invention may produce a selected magnetic field for the receiver to respond, then verifies that a stimulus (e.g., shock stimulus) was produced utilizing a voltage measuring circuit. The voltage measuring circuit applies a load across both of the correction probes at the animal stimulus receiver (indicative of the load encountered by the application of animal flesh), then measures via averaging the voltage produced across this load while the animal stimulus receiver is correcting the animal. A level detection circuit may determine if the stimulus level is sufficient for normal operation, and an indication of this is given to the consumer.

In addition, the cradle of the invention may monitor battery charging, and may provide an indication when charging is complete.

The cradle of the invention may also include additional detectors that detect and report failures of the animal stimulus receiver. A common failure mode of animal stimulus receivers (e.g., animal receiver collars) is the intrusion of water, which causes corrosion. Corrosion contributes to higher than normal current draw and may eventually prevent operation of the unit. If the receiver has significant corrosion from water, the enhanced cradle will never detect a charge complete condition and will notify the consumer of the defective receiver. Charge termination may be determined when the charge current drops below a reference value (e.g., about 1 mA). Normal receiver operation may be about 200 μA. When water is present, the operating animal stimulus receiver current may exceed 1 mA. The animal stimulus receiver may still operate, though with a limited battery life due to the presence of corrosion.

Another failure mode of the animal stimulus receiver may pertain to the electrical connections made inside the receiver to the correction probes. Attached to the correction probes is a pulse transformer for generating high voltages. Typical resistance of the secondary winding of the pulse transformer is on the order of 1 M. If the pulse transformer wires disconnect or break from the probes, then the voltage will arc to the probes, diminishing energy delivery to the animal.

The cradle of the invention may utilize the secondary impedance of the pulse transformer to power up. A voltage supply circuit comprised of a P-channel semiconductor device (e.g., MOSFET, bipolar) may search for the probes on the receiver collar to supply a ground path to bias on the voltage supply circuit. Indeed, one of the probes of the animal stimulus receiver may function as a common ground upon engagement with the cradle.

The cradle of the invention may produce an actuator signal for the animal stimulus receiver. In order to draw a selected stimulus from the receiver, both the signature and amplitude of the actuation signal may be matched to the signal designated or indicated to produce the selected stimulus. This actuation followed by production of the stimulus demonstrates that the receiver is responding to the appropriate signal at the appropriate level. Defects in the animal stimulus receiver (e.g., corrosion, damaged component, failed component) can cause the receiver to become less sensitive to the actuation signal, endangering the animal by causing a decrease in the distance the receiver activates from a perimeter boundary. Moreover, the animal stimulus receiver may fail to produce a selected stimulus (e.g., shock stimulus) if the antenna, amplifier, and/or detection circuitry in the receiver is compromised when the cradle produces the selected signal at the appropriate amplitude and signature.

Additionally, a further embodiment of the cradle of the invention may include detection of an auditory or vibrational stimulus produced by the animal stimulus receiver upon reception of a selected actuation signal. For example, the cradle of the invention may detect an audible beep or vibration produced by the receiver. In the case of an auditory stimulus, detection may be accomplished through the use of a microphone, and a band-pass amplifier arrangement to only "listen" to the tones produced by the receiver. Output of the amplifier may pass through a detector and then averaged to check for correct amplitude. Regarding vibrational stimuli detection, the cradle may include a motion detector.

In another aspect, the invention includes a method for charging and testing an animal stimulus receiver with a charger or cradle having charging circuitry and stimulus detection circuitry. The method may include activating at least one of the charging circuitry and stimulus detection circuitry. The method may also include applying an actuation signal to the animal stimulus receiver, where the actuation signal may be selected to cause the animal stimulus receiver to generate a selected stimulus at the stimulus detection circuitry. Moreover, the method may include detecting whether the selected stimulus was generated at the stimulus detection circuitry. Additionally, the method may include charging a battery of the animal stimulus receiver with the charging circuitry for a selected period of time.

In an exemplary method of the invention, an animal stimulus receiver may be inserted into a cradle of the invention. Connection to receiver prongs by cradle contact springs may activate the cradle electronics. The cradle may then delay about 1.5 seconds for the power supply to stabilize. As an initial test, the charging circuitry may be disabled. During the initial test, green and red LEDs may alternatively flash to indicate a test is taking place. The cradle may then provide a variety of actuation signals to the animal stimulus receiver by modulating the carrier frequency and signature of such actuation signals. Each actuation signal may be produced for several seconds, and the output of the stimulus detection circuitry may be monitored for a response. If the cradle receives a response from the stimulus detection circuitry, it may then blink green and enter the charging state. However, if the cradle does not receive a response from the stimulus detection circuitry after all permutations have been attempted, the cradle may blink red and enter the charging state. At this point, the animal stimulus receiver may be defective, or its battery may be compromised or dead.

During the charging state, the cradle may monitor the output of a high side current monitor to keep track of the level of charge current the battery is accepting. The cradle may then poll the current monitor once per minute. Termination of charge may occur when the charge monitor reports a current draw below about 1 mA or if about 4 hours have elapsed. If the battery does not charge within about 4 hours, the cradle may illuminate a solid red LED to indicate the animal stimulus receiver is faulty. When the charge monitor reports that the charge is complete, the cradle may do one of two things depending on whether or not it received a stimulus response in the initial test. If the cradle received a stimulus response in the initial test, it may simply illuminate a solid green LED to indicate that the receiver is good and charge is complete.

However, if a stimulus response was not received in the initial test, the cradle may once again produce all permutations of the actuation signal and may again monitor the stimulus detection circuitry for a response. If a stimulus response is now received, the cradle may illuminate a solid green LED to indicate the receiver is good and charging has completed. If a stimulus response is not received, the cradle may illuminate a solid red LED to indicate the receiver may be defective. When the animal stimulus receiver is removed from the cradle, the cradle may power down.

BRIEF DESCRIPTION OF THE DRAWINGS

The foregoing summary and the following detailed description of the exemplary embodiments of the present invention may be further understood when read in conjunction with the appended drawings, in which.

DETAILED DESCRIPTION OF THE INVENTION

Figure 1:
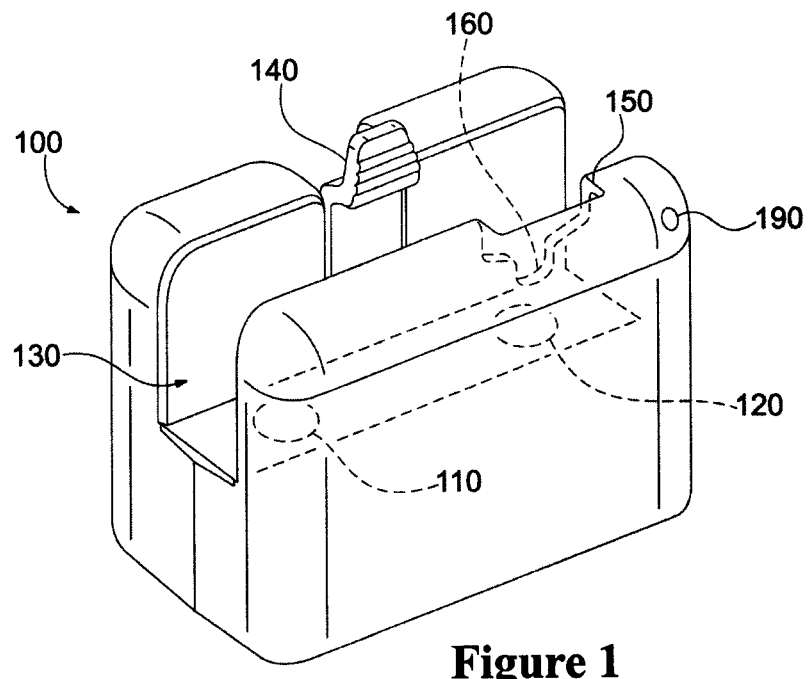
FIG. 1 schematically illustrates a front view of an exemplary charger of the invention.
Figure 2:
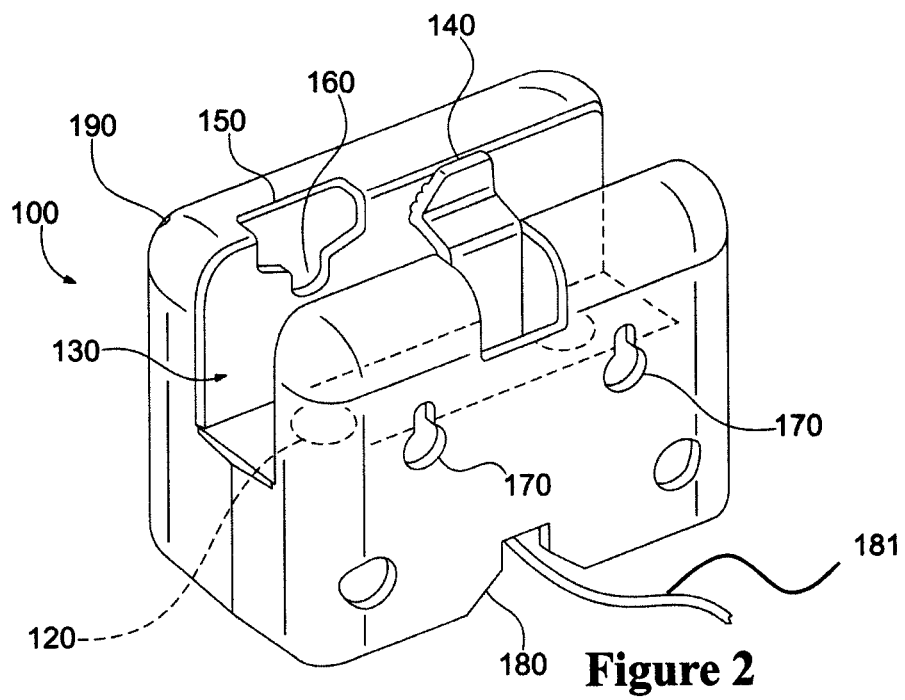
FIG. 2 schematically illustrates a rear view of the exemplary charger of the invention.

Referring now to the figures, wherein like elements are numbered alike throughout, FIGS. 1 and 2 illustrate front and rear views, respectively, of an exemplary charger or cradle 100.

Figure 3:
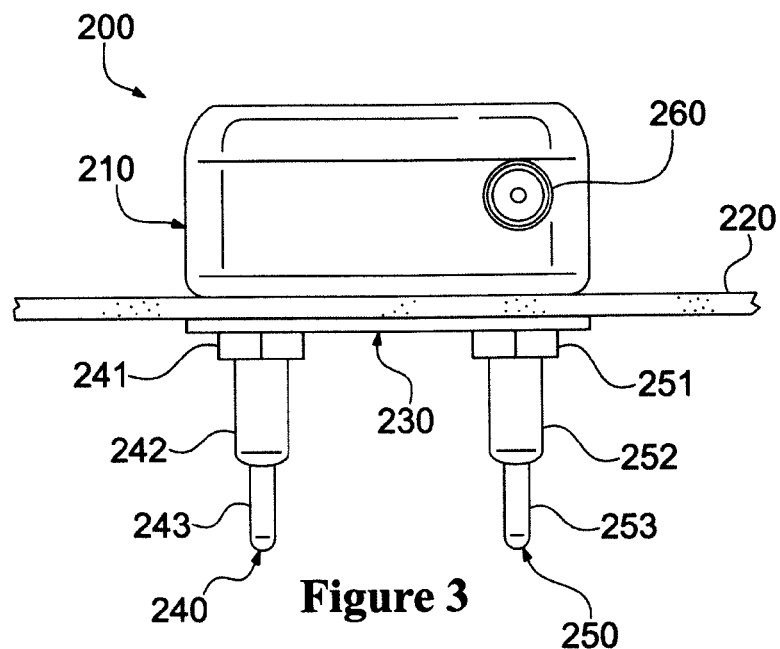
FIG. 3 schematically illustrates an animal stimulus receiver that may be used in conjunction with the exemplary cradle of the invention.

Cradle 100 is provided for charging and testing an animal stimulus receiver, such as the animal stimulus receiver 200 depicted in FIG. 3. Specifically, the cradle 100 may charge a battery of the animal stimulus receiver 200 and test the stimulus circuitry of the animal stimulus receiver 200. The stimulus circuitry being tested includes a stimulus generator that may deliver a stimulus to an animal upon the reception of a selected actuation signal. Ordinarily, the user of the animal stimulus receiver, such as the one depicted in FIG. 3, may be required to either presume the continued functionality and operability of the receiver or test the animal stimulus receiver on his or her self. Rather than subject a user to the uncertainty of the receiver's continued operability, the cradle 100 of the invention may engage with an animal stimulus receiver 200 to both charge the receiver and apply a variety of selected actuation signals to determine the receiver's continued functionality and operability.

Turning to the components of the device of the invention in FIGS. 1 and 2, the cradle 100 may include an engagement passage 130. The engagement passage 130 allows for seating and support of the animal stimulus receiver 200 at the cradle 100. Moreover, the passage 130 may aid in aligning certain components of the animal stimulus receiver 200 with corresponding contact points on the cradle 100. The cradle 100 may further include several contacts that facilitate connections with circuitry on board the cradle 100. For example, as depicted in FIG. 1, the cradle 100 may include external contacts 110 and 120 that may allow for reception of protrusions or a boss of the animal stimulus receiver 200. Moreover, external contacts 110 and 120 may include a conductive portion that allows for communication between the circuitry of the cradle 100 and animal stimulus receiver 200. Specifically, external contacts 110 and 120 may allow for electrical communication between the stimulus detection circuitry of the cradle 100 and a stimulus generator of the animal stimulus receiver 200. Additionally, cradle 100 may include a charging contact 160 that may be disposed within a charging contact channel 150. The channel 150 may be a groove or cut out from the engagement passage 130 provided that it may accommodate the charging contact 160 and facilitate engagement between the charging contact 160 and a boss of the animal stimulus receiver 200.

In an additional embodiment, the engagement passage 130 may include an engagement latch 140 that secures the animal stimulus receiver 200 within the passage 130 and prevents substantial movement of the receiver 200 within the passage 130. By preventing movement of the receiver 200, the engagement latch 140 may prevent loss of contact or communication between a contact of the cradle 100 and the animal stimulus receiver 200.

Additionally, the cradle 100 may include an output indicator 190 that may be disposed on the body or surface of the cradle 100. For example, the indicator 190 may include one or more LEDs that allow for the display and communication of device information to a user. In certain aspects, the output indicator 190 may include green and/or red LEDs that may be used to display and communicate device information to a user. Moreover, the cradle 100 may include one or more mounting eyes 170 to allow for placement of the cradle 100 on a surface, such as a wall.

Cradle 100 may also include one or more ports (not shown in figures) on a surface of the cradle 100 within or at a power supply channel 180. The power supply channel 180 may allow for a power supply connector 181 to be placed in electrical communication with the circuitry of the cradle 100 via a port at the cradle 100. The power supply connector 181 may connect to a jack of the circuitry of the cradle 100 and may further connect to a power supply so that a voltage may be applied to the circuitry of the cradle 100 upon activation of such circuitry. In certain embodiments, the power supply connector 181 may communicate about 0.1 to 100 volts to the circuitry of the cradle 100. In other embodiments, the power supply connector 181 may communicate about 1 to 10 volts to the circuitry of the cradle 100. The power supply connector 181 may also communicate about 5 volts to the circuitry of the cradle 100.

Regarding engagement between the cradle 100 and the animal stimulus receiver 200, the exemplary animal stimulus receiver 200 in FIG. 3 may have a receiver electronics housing 210 that encloses a stimulus generator, a stimulus receiver, and one or more batteries that provide power to the stimulus receiver and the stimulus generator. The animal stimulus receiver 200 may further include stimulus probes or prongs 240 and 250, which are connected to the stimulus generator of the animal stimulus receiver 200. Additionally, the animal stimulus receiver 200 may include a charging boss 260, which is connected with one or more batteries of the animal stimulus receiver 200. During operation, the animal stimulus receiver 200 may receive an actuation signal at the stimulus receiver that is selected to produce a specific stimulus. Stimuli that may be used in accordance with the invention may include shock stimuli, vibration stimuli, and/or auditory stimuli. For example, where an animal stimulus receiver (such as animal stimulus receiver 200) is designed to provide a shock stimulus, the stimulus receiver will first receive a shock stimulus actuation signal from a transmitter. When the animal stimulus receiver 200 is functionally normally, a voltage will then be applied across the stimulus prongs 240 and 250 by the stimulus generator, thereby correcting an animal's behaviour through the application of a painful shock at the stimulus prongs 240 and 250.

As shown in FIG. 3, a portion of the stimulus prongs 240 and 250 may exit the receiver electronics housing 210 and pass through a collar 220. A positioning bracket 230 may be disposed against the collar 220 with receiver contact bosses 241 and 251 placed at the base of stimulus prongs 240 and 250. Stimulus prongs 240 and 250 may be completely rigid and each composed of a fixed length of conductive material (e.g., metal). However, the stimulus prongs 240 and 250 may include both fixed stimulus portions 242 and 252 and retractable stimulus portions 243 and 253 that may retract when opposed by a force. Indeed, retractable stimulus portions 243 and 253 may retract when placed against an animal's flesh when the animal stimulus receiver 200 is placed at the animal in the form of a collar.

Figure 4:
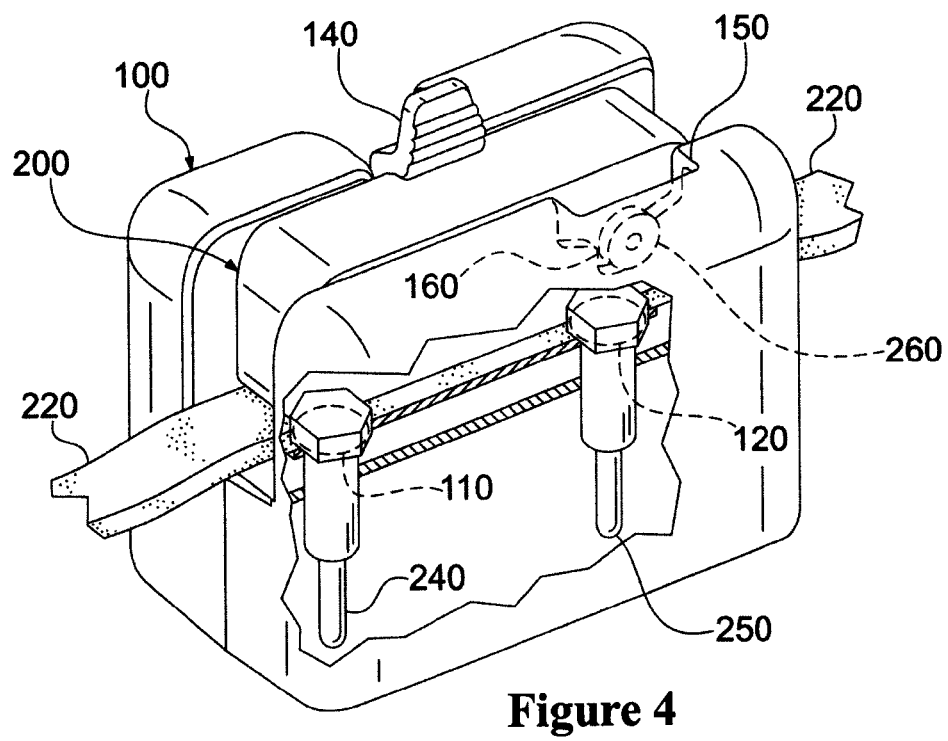
FIG. 4 schematically illustrates the animal stimulus receiver engaged with the exemplary charger of the invention.

Referring now to FIG. 4, when the animal stimulus receiver 200 is engaged with the cradle 100 for charging and testing, then animal stimulus receiver 200 may be placed in the engagement passage 130. In certain aspects, the charging boss 260 may align with, and contact, the charging contact 160. Furthermore, upon engagement, the stimulus prongs 240 and 250 may pass through external contacts 110 and 120 and a conductive portion of each of external contacts 110 and 120 may contact a surface of each of stimulus prongs 240 and 250. The receiver contact bosses 241 and 251 may be provided to contact the conductive portions of external contacts 110 and 120, respectively. Upon seating and engagement of the animal stimulus receiver 200 at the cradle 100, the external contacts 110 and 120 may be in electrical communication with the stimulus generator of the animal stimulus receiver 200 through receiver contact bosses 241 and 251. And furthermore, the charging contact 160 may be in electrical communication with one or more batteries of the animal stimulus receiver 200 through the charging boss 260.

After engagement of the animal stimulus receiver 200 with the cradle 100, when the cradle is powered by a power source through, for example, power supply connector 181, the engagement will activate the circuitry of the cradle 100 and begin a process of charging one or more batteries and/or testing the stimulus generator of the animal stimulus receiver 200.

Figure 5:
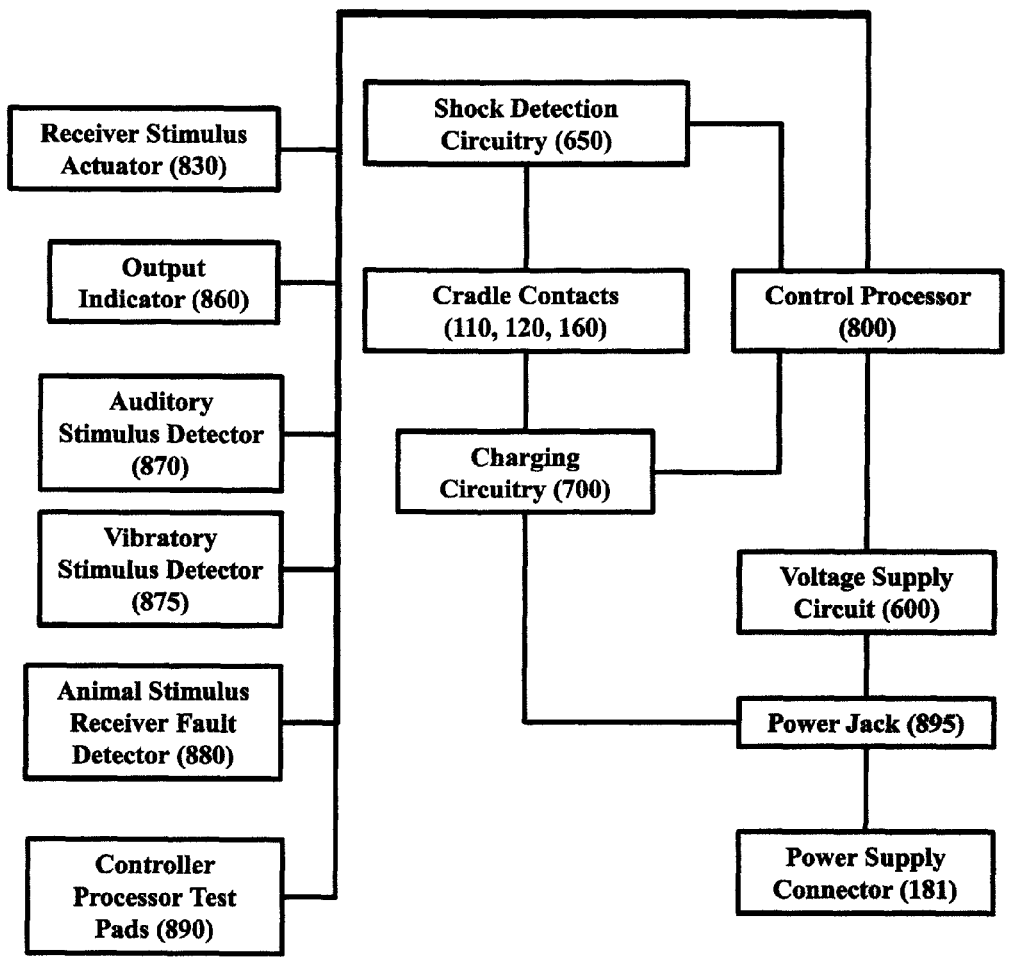
FIG. 5 diagrammatically illustrates components of the exemplary charger of the invention.

Referring now to FIG. 5, cradle 100 may include a variety of components that allow both for charging one or more batteries and testing the stimulus generator of the animal stimulus receiver 200. The circuitry of the cradle 100 is connected to the cradle contacts 110, 120, and 160, described above. At least one of the external contacts 110 and 120 may function as a permanent ground.

The cradle 100 may include shock detection circuitry 650 that may be connected to the animal stimulus receiver 200 through external contacts 110 and 120. The shock detection circuitry 650 may receive the shock produced by the animal stimulus receiver 200 and determine if any shock was produced and, moreover, if the shock produced was expected based upon the stimulus actuation signal provided to animal stimulus receiver 200. The shock detection circuitry 650 may include level detection circuitry that may determine whether the shock stimulus produced includes a level of shock indicative of normal operation of the animal stimulus receiver 200. Furthermore, the shock detection circuitry 650 may also include voltage measuring circuitry that may verify that the shock stimulus was produced. The voltage measuring circuitry may also provide a load to the external contacts 110 and 120 that is indicative of the load provided by animal flesh.

The cradle 100 may further include a control processor or circuitry 800 that may be connected with the shock detection circuitry 650. The control processor 800 may include microprocessor U1. The cradle 100 may further include a receiver stimulus actuator 830, an output indicator 860, an auditory stimulus detector 870, a vibratory stimulus detector 875, an animal stimulus receiver fault detector 880, control processor test pads 890, or a combination thereof. Each of the receiver stimulus actuator 830, output indicator 860, auditory stimulus detector 870, animal stimulus receiver fault detector 880, control processor test pads 890, or a combination thereof, may be connected to the control processor 800 as illustrated in FIG. 5.

The control circuitry 800 may further include a non-transitory storage medium that may store data, a computer readable program, and/or other code that may be read by a computer or processor. Storage media may include, for example, floppy disks and diskettes, compact disk (CD)-ROMs (whether or not writeable), DVD digital disks, RAM and ROM memories, computer hard drives and back-up drives, external hard drives, "thumb" drives, and any other storage medium readable by a computer.

The control circuitry 800 may monitor the shock detection circuitry 650 and determine if a shock has been detected at the shock detection circuitry 650 by the animal stimulus receiver 200. The control circuitry 800 may, through the receiver stimulus actuator 830, provide a stimulus actuation signal to the stimulus receiver of the animal stimulus receiver 200. Specifically, the receiver stimulus actuator 830 may provide an actuation signal that activates the stimulus generator of the animal stimulus receiver 200 and thereby causes the animal stimulus receiver 200 to generate a stimulus through stimulus prongs 240 and 250.

The stimulus actuation signal may be adjusted and/or selected to produce a selected stimulus by the stimulus generator at the animal stimulus receiver 200. The receiver stimulus actuator 830 may include a transmitter and may, in certain aspects, include an antenna. As used herein, the term "antenna," may include, but is not limited to, a metallic or conductive device (such as a wire) for transmitting and/or receiving radio waves and/or generating magnetic fields.

The control circuitry 800 may be connected with an output indicator 860 that may display or otherwise indicate an output produced by the control processor 800. The output indicator 860 may include, for example, an LCD display, one or more LEDs, or a combination thereof. In certain aspects, the output indicator 860 may display at least one of the battery charge status, stimulus status, and fault status. More specifically, such output may be indicative of a battery charge status, a fault status as detected by the animal stimulus receiver fault detector 880, or the stimulus status of the animal stimulus receiver 200 as may be detected at the shock stimulus circuitry 650, auditory stimulus detector 870, and/or vibratory stimulus detector 875.

The fault status detected by the animal stimulus receiver fault detector 880 may be, for example, a short circuit fault status, a wire corrosion fault status, or a combination thereof. The battery charge status may be, for example, a charge in process status, a battery fault status, a battery charge complete status, or a combination thereof. The stimulus status may be, for example, a correct stimulus produced status, an incorrect stimulus produced status, a non-production of stimulus status, or a combination thereof.

Figure 8:
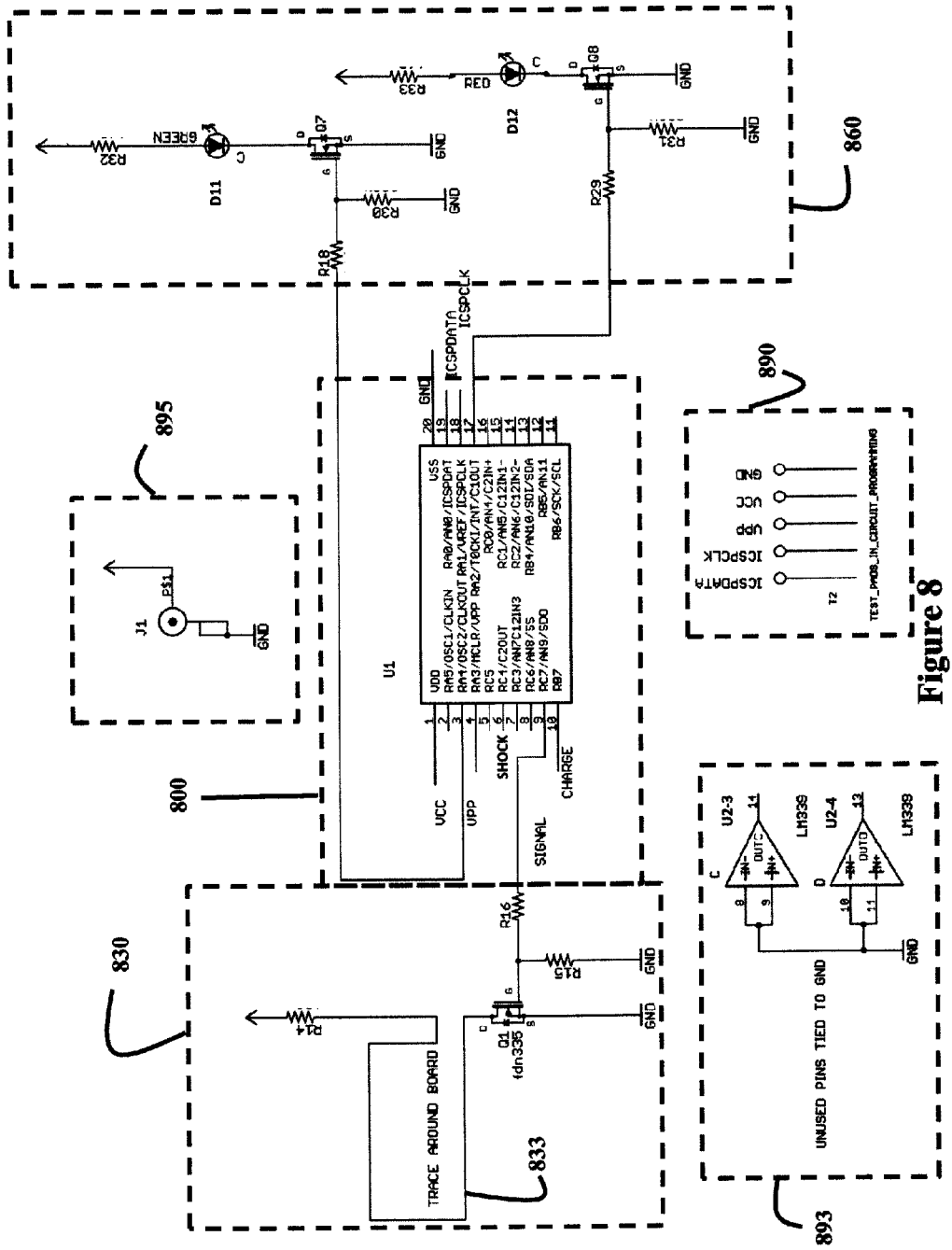
FIG. 8 illustrates a circuit diagram that includes an exemplary control processor, a receiver stimulus actuator, an output indicator, a power jack, unused pins of the control processor tied to ground, and test pads used for programming the control processor.

The control circuitry 800 may also include controller processor test pads 890 that allow a user to configure a function of the control processor 800 or otherwise interact with the control circuitry 800. As shown in FIG. 8, the control circuitry 800 may also include one or more unused pins 893, which may be connected to additional detectors, receivers, transceivers, or transmitters. However, the one or more unused pins 893 of the invention may, in certain aspects, be tied to a ground.

The circuitry of the cradle 100 may further include charging circuitry 700 that may charge one or more batteries of the animal control receiver 200 through, for example, cradle contacts 120 and 160 (i.e., external contact 120 and charging contact 160). The charging circuitry 700 may be connected with the control circuitry 800 and provide a charge status to the control circuitry 800. The charging circuitry 700 may detect the level of charge at one or more batteries of animal stimulus receiver 200 and may then provide a voltage and current to the one or more batteries when such batteries are below a selected threshold of charge. Moreover, when one or more batteries of the animal stimulus receiver 200 are above a selected threshold of charge, the charging circuitry may detect that the selected threshold has been met or exceeded and may terminate charging of the batteries.

Additionally, the charging circuitry 700 may detect when one or more batteries of the animal stimulus receiver 200 are faulty because such batteries will not become fully charged. As described herein, a battery may be faulty when it is incapable of being fully charged in about four hours. For example, the charging circuitry 700 detects a faulty battery at the animal stimulus receiver 200, charging of the battery will cease and the output indicator 860 will indicate such information to the user.

The cradle 100 may further include a voltage supply circuit 600 that may allow the control circuitry 800 to draw power from a power jack 895 through the power supply connector 181. The power supply connector 181 may be connected to a power source such as, for example, an electrical power source, a battery power source, or any other source of power that may be used to provide a DC or AC voltage (subject to conversion) to the cradle 100. The term "battery," as used herein, may refer to an electro-chemical device comprising one or more electro-chemical cells and/or fuel cells, and so a battery may include a single cell or plural cells, whether as individual units or as a packaged unit. A battery is one example of a type of an electrical power source suitable for a portable device.

Engaging the animal stimulus receiver 100 with the cradle 200 closes the circuit and provides a ground through external contact 120, thereby providing power to the control processor 800 and activating the charging circuitry 700 and stimulus detection circuitry (e.g., shock detection circuitry 650). Thus, the voltage supply circuit 600 may allow the control processor 800 to draw power from a power source. Additionally, the voltage supply circuit 600 may also include a shock protector or voltage clamp that protects the control processor 800 from receiving a shock stimulus voltage from the animal stimulus receiver 200 during testing.

Figure 6:
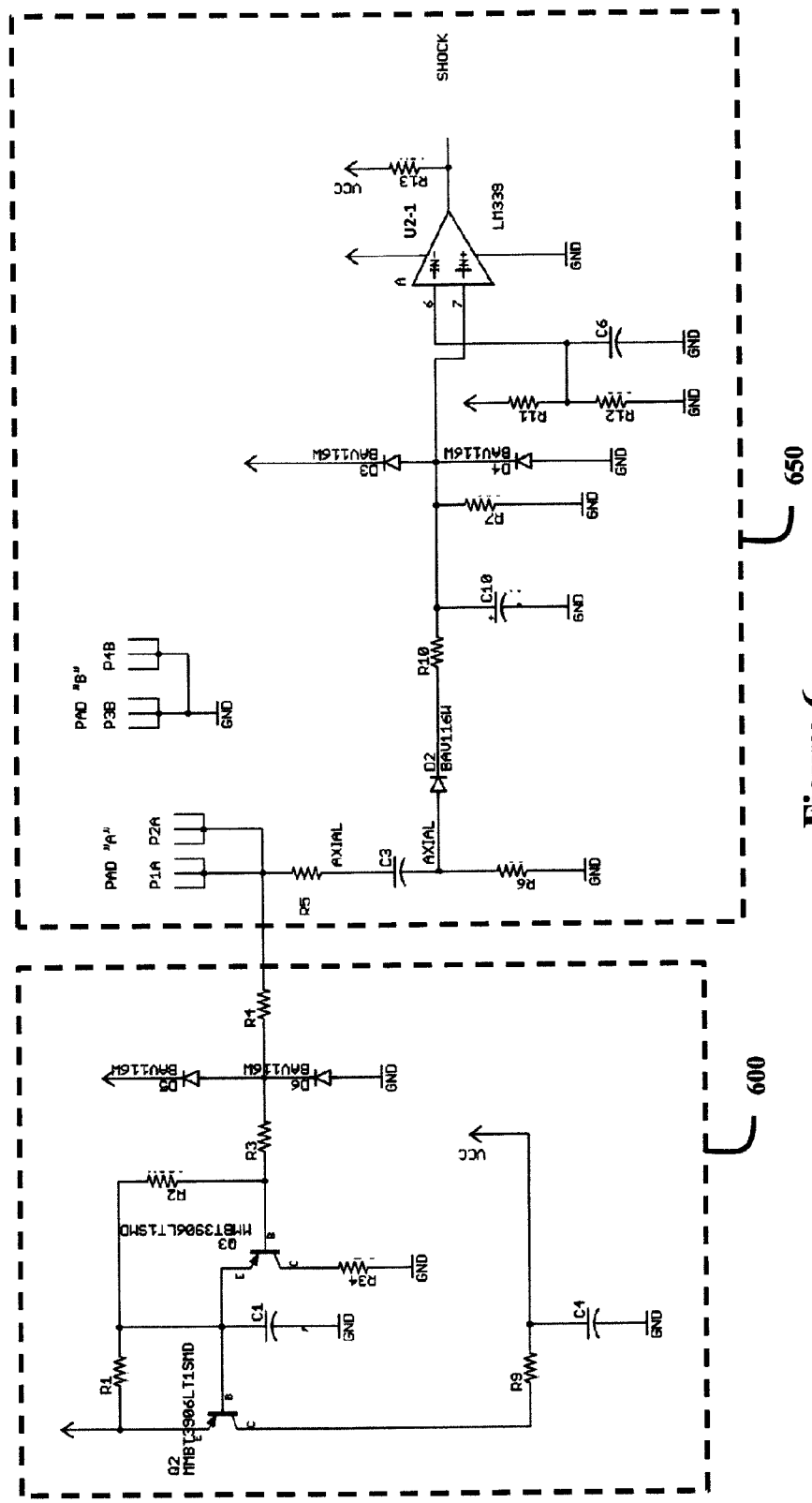
FIG. 6 illustrates a circuit diagram that includes exemplary voltage supply circuitry and shock detection circuitry.
Figure 7:
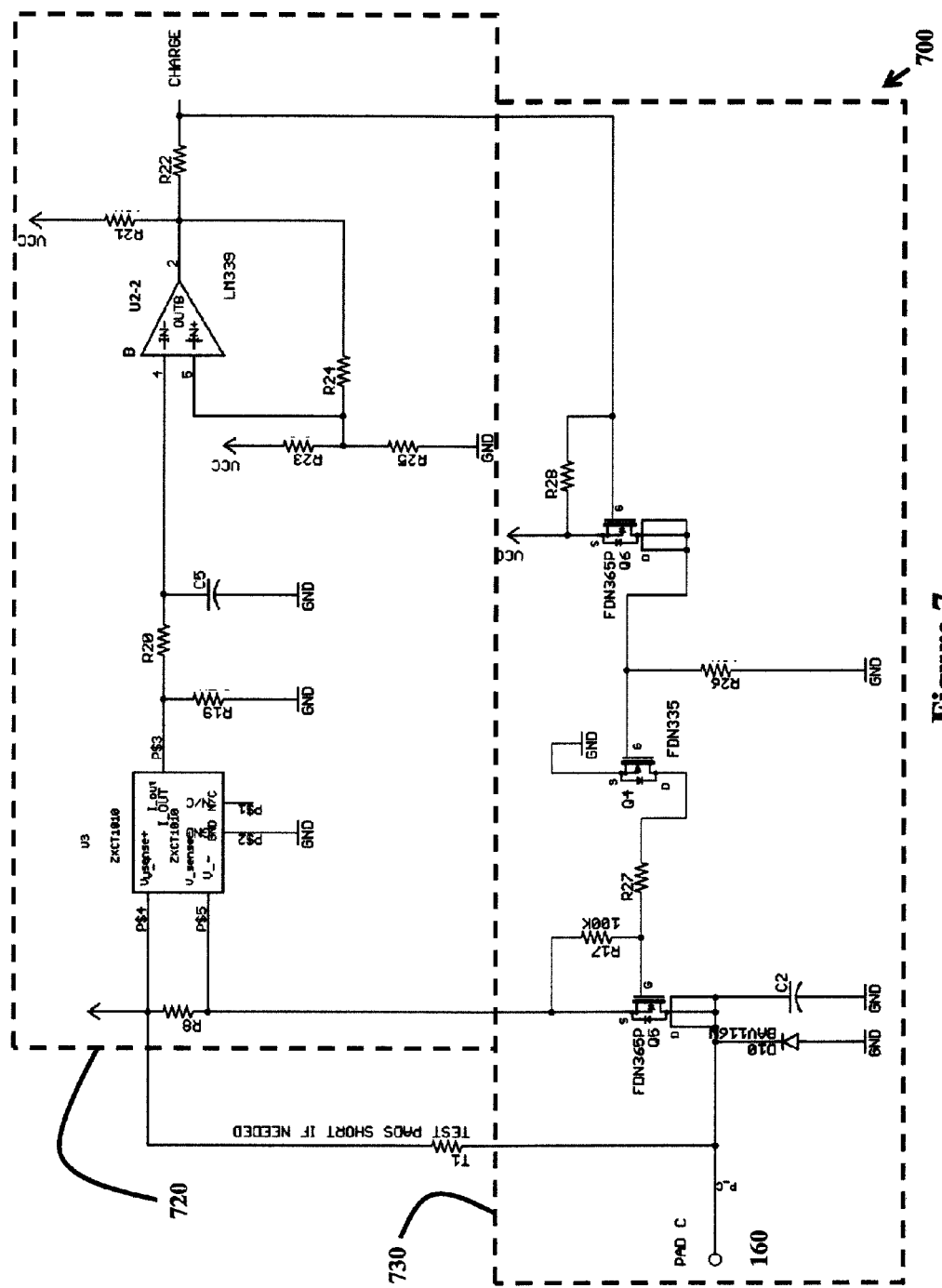
FIG. 7 illustrates a circuit diagram that includes exemplary charging circuitry.

Referring to a particular embodiment more specifically, the circuitry of the charge unit 100 is provided in FIGS. 6-8. As shown therein, the charge unit 100 includes internal circuitry enclosed within the housing to operate the charger and perform selected functions such as charging the battery of an animal collar and testing selected functionality of the animal collar such as the application of an animal stimulus, such as a shock generated at the probes of the animal collar, when the collar is mounted on the charger. As shown in FIG. 8, the charger 100 includes power a connection port 895 in the form of an external jack J1 for electrical connection with an AC to DC converter that plugs into a wall outlet to supply a 5V DC power source to the charger circuitry. The jack J1 of the charger is connected between ground and such 5V power source to provide the 5V source to the operational circuitry of the charger.

Referring to FIG. 8, the charger 100 includes controller circuitry 800 for controlling operation of the charger circuitry. In this regard, the controller circuitry 800 may include a processor such as processor U1 to monitor and control operation of the charger circuitry and for controlling the indication of certain outputs. For example, processor U1 may function to monitor the production of an animal stimulus from the animal collar in response to an actuator signal enabled by the processor U1 to ascertain whether the production of an animal stimulus is operating properly or as desired. Processor U1 may function to monitor an output of stimulus detection circuitry 650 shown in FIG. 6, such as the SHOCK signal from the stimulus detector circuitry 650, to detect, for example, that the generation of a desired shock has been effected by the animal collar in response to an activation signal produced by the processor U1 at the SIGNAL line shown in FIG. 8. For this purpose, the controller circuitry 800 is also connected with receiver stimulus actuator circuitry 830 so that the processor U1 may cause the receiver stimulus actuator circuitry 830 to produce the appropriate activation signal, such as an appropriate electromagnetic signal, on an internal loop 833 comprised of a PCB trace which runs the periphery of the periphery circuit board and functions as an antenna to transmit the actuation signal to the animal receiver mounted on the charger 100 with the shock probes of the animal receiver in electrical connection with Pads A and B as shown in FIG. 6 in order to actuate the shock circuitry of the animal receiver connected at the cradle of the charging unit. As shown in FIG. 8, the processor U1 is connected with the stimulus actuation circuitry 830 by the SIGNAL line so that the processor can send an activation SIGNAL on the SIGNAL line to cause a desired stimulus activation signal to be produced at the PCB trace 833 to activate the dog collar to produce a stimulus that can be detected by the stimulus detection circuitry 650 connected with Pad A as shown in FIG. 6 which, in response, produces an output signal SHOCK that is monitored by the processor U1 to verify whether a desired shock stimulus was produced by the animal collar if the expected stimulus is not generated in response to the activation signal, the SHOCK line will not produce an indication of shock. Optionally, the processor U1 may run through a series of different activation signals in an attempt to generate a shock. In any event, if a shock is not generated by the one or optionally more activation signals, the processor U1 can determine that the stimulus of the animal collar may not be functioning properly. As such U1 functions to monitor a correction or shock stimulus through stimulus detection circuitry 650.

The processor U1 may also function to monitor and control a charge control circuit 700, as shown in FIG. 7, that functions to supply and monitor the charge current to the animal receiver through Pad C. First, the processor U1 may function to monitor the output of the charge control circuitry 700 at the CHARGE line through current monitor circuitry 720 connected between the 5V source and Pad C which functions to monitor the flow of charge current from the 5V source to Pad C and produces an output at the CHARGE line reflective of the flow or such charge current. For this purpose, processor U1 may monitor to the output of the current monitor circuitry 720 at the CHARGE LINE as input to the CHARGE PIN of processor U1 to enable processor U1 to monitor whether the battery of the dog collar is or has been properly charged. Secondly, the processor U1 may optionally provide an output at the CHARGE pin of the processor U1 for supply to switch circuitry 730 connected between the 5V and Pad C in order to switch the supply of charge current to the animal receiver on and off. The processor U1 may also function to turn on and off output indicators, such as output indicator 860 which may be provided in the form of LEDs such as a green LED D11 and/or a red LED D12. In this regard, the processor U1 may function to illuminate the LEDs as desired, for example, by selectively switching the LEDs on and off, for example, to enable a solid green LED or a blinking green LED and/or a solid red LED or a blinking red LED.

As shown in FIG. 8, the processor U1 is a 20 pin processor. Not all pins may be needed, and as shown in the embodiment of FIG. 8, pins 2, 5, 7, 8 and 11-16 are not used. Pin 1 is connected to the VCC line of the supply voltage switch circuit 600 to monitor whether switch circuit 600 has switched supply voltage VCC on and off (shown in FIGS. 6 and 8.) Pin 3 is connected through resistor R18 to the gate of switching MOSFET transistor Q7 to turn green LED D11 on and off. For example, the green LED can be caused to blink when the battery of the animal receiver is charging and/or the green LED D1 may be caused to emit solid green when the animal receiver has been fully charged and the stimulus applied by the animal receiver, such as the shock generation, has been detected or determined to work properly. The gate of the transistor Q7 is also connected to ground via resistor R30. The source of the transistor Q7 is connected to ground. The drain of Q7 is connected to the 5V source though resistor R32 and the green LED D11. When the switching transistor Q7 is turned on by the signal from Pin 3 of U1 the green LED will illuminate and when the transistor Q7 is turned off by U1 the LED 11 will not illuminate. For example, the green LED may illuminate solid when the battery of the collar has been fully charged and a desired shock has been detected in response to an actuation signal effected by the processor. Alternatively, the green LED may be switched on and off to blink to indicate the battery of the collar is being charged. Similarly, Pin 17 of the processor U1 is connected to the gate of a MOSFET switching transistor Q8 through resistor R29. The gate of the transistor Q8 is also connected to ground through resistor R31. The source of switching transistor Q8 is also connected to ground. The 5V source is connected through resistor R33 and the red LED D12 to the drain of Q8. Accordingly, when the processor U1 turns the switching transistor Q8 on by a signal at Pin 17 the red LED will illuminate and when processor U1 turns off the transistor Q8 the red LED D12 will not illuminate. The red LED for example, may illuminate solid if the battery of the animal receiver cannot sustain a charge. The red LED D12 may blink red through on and off signals from Pin 17 if the battery can sustain a charge but the actuation of a stimulus such as the shock cannot be detected.

The controller circuitry 800 also includes test pad circuitry 890 that includes a test pad T2 used in the programming and monitoring of the processor U1. The test pad T2 includes an ICSPDATA line pad that is connectable with Pin 19 of processor U1 to provide data. Test pad T2 also includes an ICSPCLK line pad to communicate clock signals with Pin 18 of processor U1. The Test Pad T2 also includes a VPP line pad connected with the input Pin 4 of processor U1 to provide a voltage programming pulse to enable programming of processor U1. Test Pad T2 also includes a VCC line pad that is connectable with the VCC Pin 1 of processor U1. The Test pad T2 also includes a ground line pad GND connectable to the ground Pin 20 of the processor U1.

Pin 9 of processor U1 provides a SIGNAL line that is connected with the receiver stimulus actuator circuitry through resistor R16 to the gate of a MOSFET switch transistor Q1. The gate of transistor Q1 is also connected to ground through resistor R15. The source of transistor Q1 is connected to ground. The drain of transistor Q1 is connected to the electrical trace 833 around the periphery printed circuit board, PCP board, and then with resistor R14 to the 5V source. As such, the SIGNAL line at Pin 9 from the processor U1 is connected to the receiver stimulus actuator circuitry 830. In this regard, the processor U1 can cause the SIGNAL line to turn switching transistor Q1 on and off in a selected pattern to generate a particular actuating signal at the trace 833 in an attempt to cause the animal receiver connected in the cradle to generate an electrical shock across Pad A and Pad B as shown in FIG. 6. If a shock is generated in response to the activation signal generated in response to the SIGNAL LINE, the stimulus detection circuitry 650 shown in FIG. 6 will function to produce signal at the SHOCK line which is supplied to Pin 6 of the processor U1 so that the processor can monitor and verify if the animal collar procedures a shock in response to a particular actuation signal. For this purpose, Pin 6 of U1 is connected to the SHOCK line of the stimulus detector circuitry 650 shown in FIG. 6.

Pin 10 of the processor U1 is connected to the CHARGE line of the charge control circuit 700 as shown in FIG. 7 and functions as an output to the switch circuitry 730 to cause switching transistor Q5 to turn on and off so that the 5V source can be switchably connected with Pad C so that charging current can be supplied to the animal receiver through Pad C. The CHARGE pin of processor U1 may also function as an input to monitor the output of the current monitor circuitry 720 to monitor charging of the animal receiver after charge initiation has commenced so that when the battery of the animal receiver no longer take a charge, or a sufficient charge, the reduction in charge current to the animal receiver is detected by the voltage drop across resistor R8 so that the processor U1 can then terminate the charging process and turn off switching transistor Q5 to disconnect the 5V source from Pad C.

Referring to FIG. 6, the charger 100 includes animal receiver stimulus contact pads Pad A and Pad B for electrical connection with the external contacts 110 and 120 on the external housing of the charger to electrically connect with the stimulus probes of an animal receiver collar. Insertion of an animal receiver into the cradle enables the contact probes of the animal receiver to make electrical contact with external contacts 110 and 120 so that electrical connection is made from Pad A through the secondary coil of the shock coil of the animal receiver to Pad B which in turn is connected to ground. The charger 100 also includes a voltage supply switch circuit, generally designated 600, which functions to switch the 5V source on and off to selectively supply a supply voltage VCC to the operational circuitry of the device. In general, when the impedance of the secondary coil of the animal receiver pulse transformer is electrically connected at Pads A and B, bias current from the base of switching transistor Q3 can flow through Pad A, then through the secondary coil, then to Pad B and then to ground, thus turning on switching transistor Q3 which in turn subsequently turns on switching transistor Q2 which in turn causes the 5V source to supply the supply voltage VCC at line VCC to the charger circuitry. The collector of transistor Q2 is connected to the VCC output through Resistor R9. A capacitor C4 is connected from the VCC output to ground. The emitter of transistor Q2 is connected to the 5V source. Resistor R1 is connected between the 5V source and the base of transistor Q2. A capacitor C1 is connected between the base of transistor Q2 and ground. Resistor R1 and capacitor C1 provide an RC delay time constant into the base of switching transistor Q2 which permits Q2 to remain turned on during situations in which switching transistor Q3 is temporarily switched on and off when the animal receiver connected between Pad A and Pad B generates a correction shock. Resistor R2 is connected between Resistor R1 and the base of switching transistor Q3. The emitter of Q3 is connected between Resistor R1 and capacitor C1 to the base of Q2. The collector of Q3 is connected through Resistor R34 to ground. The base of Q2 is connected to a Resistor R3 and Resistor R4 to Pad A. A clamping circuit includes diode D5 connected between Resistor R3 and R4 and the 5V source and diode D6 connected between Resistors R3 and R4 and ground to provide a clamping function to protect switching transistor Q3 from the high voltages generated by the receiver collar during shock generation.

Referring again to FIG. 6, the charger 100 includes stimulus detection circuitry 650 connected with Pad A and arranged to produce output at the SHOCK line as discussed, the animal receiver collar may generate a shock in response to a SIGNAL line signal from the controller circuitry 800. More generally, in order to detect the generation of a stimulus by the animal receiver in response to a signal line signal, the charger 100 includes stimulus detection circuitry 650 shown in FIG. 6, which functions to detect the generation of a stimulus by the animal receiver across Pads A and B. The stimulus detection circuitry 650 may preferably function to detect the generation of an electrical shock although such circuitry 650 could also be used or modified to detect other stimulus signals such as audible signalling and/or vibrational signalling. When used as for shock detection, as shown in FIG. 6, the stimulus detection circuitry 650 is connected with Pad A through the network of resistor R5, capacitor C3, and resistor R6 to ground. Resistors R5 and R6 function to present a load simulating the load of flesh, such as dog flesh, and also function to divide the amplitude of the pulses by a selected factor such as a factor of about 100. Capacitor C3 is provided to prevent a DC path to ground to facilitate operation of the power turn on circuitry provided by the supply voltage switch circuitry 600. A connection is provided between capacitor C3 and resistor R6. From this connection, a diode D2 is connected with resistor R10 which is in turn connected with resistor R7 to ground, also with a capacitor C10 to ground, and with an input Pin 7 of comparator U2-1 to provide an envelope detector with a relatively lengthy decay time constant for averaging purposes, such as approximately three seconds. The signal from the envelop detector is supplied to the input Pin 7 of comparator U2-1 which functions to compare the average voltage produced while the receiver is generating a shock to a known reference value supplied to the other input Pin 6 of the comparator U2-1. The output of comparator U2-1 goes high once sufficient average shock amplitude has been detected so that comparator U2-1 produces a high SHOCK signal at the SHOCK line for supply to the controller. A clamping circuit provided by Diodes D3 and D4 is provided at the input Pin 7 of the comparator U2-1 in order to clamp the magnitude of voltage supplied from the envelope detector to the input Pin 7. For example, the clamping diodes may clamp the voltage from a range of approximately −0.7 to +5.7 V for supply to the input of the comparator U2-1. A pull-up Resistor R13 is connected at the output of the comparator U2-1 and with VCC so that a high output may be supplied by the comparator. The reference input at Pin 6 of the comparator U2-1 is connected to a series resistor network R11 and R12 connected between the 5V source and ground to provide a voltage divider to supply a desired voltage to the reference input of the comparator U2-1. A capacitor C6 is connected between input Pin 6 of comparator U2-1 and ground as well as between resistors R11 and R12 and ground to smooth the reference input voltage. Comparator U2-1 may be supplied as a portion of a chip U2 that may function to supply a set of comparators such as a set of 4 comparators U2-1, U2-2, U2-3 and U2-4. If certain comparators are not needed, the inputs of such comparators may be tied to ground. For example, as shown in FIG. 8, unused comparators 893 such as comparators U2-3 and U2-4, have inputs connected to ground.

Referring to FIG. 6, when the collar is removed from the cradle of the charger 100 so as to disconnect the secondary coil of the animal receiver from Pad A and B, switching transistor Q3 of the supply voltage switch circuit 600 will be turned off which will in turn cause switching transistor Q2 to turn off which will disconnect the 5V source from the VCC supply line so as to power down the unit.

Referring now to FIG. 7, the charger 100 includes charge control circuitry 700 which functions to supply and control the supply of charge current to the battery of the animal receiver. In this regard, the charge control circuit 700 is connected to the 5V source so that a charge current may be switchably supplied through switching circuitry 720 by switch transistor Q5 to Pad C which is in turn connected to the external charge contact 160 on the charge unit 100 for connection with a mating charging contact on the animal receiver when the animal receiver is placed within the charger cradle. The charge control circuitry 700 also includes charge current monitor circuitry 720 that monitor the flow of charge current through resistor R8 and produces output CHARGE signal on the CHARGE line that is supplied to the CHARGE pin 10 of the controller U1 of controller circuit 800. In a selected configuration the charge pin 10 of the controller may optionally have a dual function both as an input to the controller U1 to monitor the output of the charge current monitor circuitry 720 to indicate when charge of the battery of the animal receiver is complete and also as an output from the controller U1 which is supplied as an input on the CHARGE LINE to the switch circuitry 730 in order to switch the charging line from the 5V source to Pad C on in order to commence the charge cycle or off to stop the charge cycle. In this regard, the charge pin 10 of controller U1 is normally configured as an input so as to monitor the status of the charge, but in order to turn the charger on, the charge pin 10 of controller U1 must temporarily be configured as an output directed to a low state to turn the charging circuitry on. More specifically, directing the CHARGE pin 10 to a low state functions to supply an input to switch circuitry 730 to turn on MOSFET switch transistor Q6 which in turn turns on MOSFET switch transistor Q4 which in turn turns on MOSFET switch transistor Q5 which thereby connects the 5V source with Pad C which thereby supplies charging current to the animal receiver through Pad C. As shown in FIG. 7, the 5V source is connected with the source of a P-channel MOSFET switch transistor Q5 through current sense resistor R8. The drain of transistor Q5 is connected with Pad C and is also connected to ground through diode D10 and through capacitor C2. The source of transistor Q5 is also connected through resistor R17 to the drain of the transistor Q5. The gate of transistor Q5 is also connected through resistor R27 to the drain of N-channel MOSFET switching transistor Q4. The source of transistor Q4 is connected to ground. The gate of transistor Q4 is connected through resistor R26 to ground and to the drain of a P-channel MOSFET transistor switch Q6. The source of transistor Q6 is connected to voltage supply VCC and to the gate of the transistor Q6 through resistor R28. The gate of transistor Q6 is also connected with the CHARGE line to receive an output from CHARGE pin 10 of the controller U1.

Now turning to the charge current monitoring circuitry 720, current sense Resistor R8 is connected across the input terminals of a high-side current monitor in the form of chip U3 that functions to supply a proportional current at its output relative to the voltage drop supplied across its input terminals as detected across resistor R8. The output of the high-side current monitor U3 is connected through resistor R20 to one of the input pins 4 of comparator U2-2. Resistor R19 is connected between resistor R20 and the output of current monitor U3 to ground. Resistor R19 functions to produce a desired voltage in proportion to the output current from the high-side current monitor U3 for supply through Resistor R20 to the input pin 4 of comparator U2-2. Capacitor C5 is connected through resistor R20 and input pin 4 to ground and functions to smooth the voltage supplied to the input pin 4 of comparator U2-2. A reference voltage is supplied to the other input pin 5 of comparator U2-2. In this regard the reference input pin 5 of comparator U2-2 is connected at intermediate resistors R25 and R23 which provide a voltage divider that is connected between voltage supply VCC and ground. The input pin 5 is also connected to the output pin 2 of comparator U2-2 through resistor R24. A voltage VCC is connected through resistor R21 to the output of comparator U2-2 so that R21 functions as a pull up resistor. The output pin 2 of the comparator U2-2 is also connected with the CHARGE line through resistor R22 which functions to provide some isolation between the output of the comparator U2-2 and the CHARGE pin 2 of the controller U1.

In operation, when the charging current passing through resistor R8 to Pad C is sufficiently high, the output pin 2 of comparator U2-2 will go to a low state, thereby supplying a low signal at the CHARGE line for supply to the input of the network of switching transistors Q6, Q4 and Q5 to latch the charger on so that charging current will continue to be supplied from the 5V source through resistor R8 through switching transistor Q5 to Pad C. The output from comparator U2-2 at this point also enables the processor to return to an input configuration so that the CHARGE pin 10 of the controller U1 then monitors the output state of the comparator U2-2. When the charge current through resistor R8 drops to below a preset level, the output of comparator U2-2 will go to a high state to indicate charge is complete. This will in turn enable the network of switching transistors Q6, Q4 and Q5 to be turned off to disconnect the 5V source from Pad C to discontinue the supply of charging current to the animal receiver.

A table of the circuit components identified in FIGS. 6-8 is set forth in Table 1

| Part Description | Part Value | Device |
| --- | --- | --- |
| C1 | 100 µF, 6.3 V | CAP_A |
| C2 | 0.1 µF | C-USC0805K |
| C3 | 0.1 µF, 12 × 6.3 V | CAP_12 × 6.3_FILM |
| C4 | 22 µF | C-USC0805K |
| C5 | 0.1 µF | C-USC0805K |
| C6 | 0.1 µF | C-USC0805K |
| C10 | 10 µF, 25 V | CPOL-USB |
| D2 | | BAV116W_SOD-123 |
| D3 | | BAV116W_SOD-123 |
| D4 | | BAV116W_SOD-123 |
| D5 | | BAV116W_SOD-123 |
| D6 | | BAV116W_SOD-123 |
| D10 | | BAV116W_SOD-123 |
| D11 | | LED_GREEN_0805 |
| D12 | | LED_RED_0805 |
| J1 | | CONN_JACK_PLUG |
| P1A | | PAD_CRADLE_.035 |
| P2A | | PAD_CRADLE_.035 |
| P3B | | PAD_CRADLE_.035 |
| P4B | | PAD_CRADLE_.035 |
| P_C | | PAD_CRADLE_.33 × .25 |
| Q1 | | FDN335N |
| Q2 | | MMBT3906LT1SMD |
| Q3 | | MMBT3906LT1SMD |
| Q4 | | FDN335N |
| Q5 | | FDC365P_SSOT6L |
| Q6 | | FDC365P_SSOT6L |
| Q7 | | FDN335N |
| Q8 | | FDN335N |
| R1 | 100k | R-US_R0805 |
| R2 | 100k | R-US_R0805 |
| R3 | 2.5k | R-US_R0805 |
| R4 | 47k | R-US_R0805 |
| R5 | 10k | R-US_0207/10 |
| R6 | 100 | R-US_R0805 |
| R7 | 330k | R-US_R0805 |
| R8 | 0.5 | R-US_R0805 |
| R9 | 10 | R-US_R0805 |
| R10 | 140 | R-US_R0805 |
| R11 | 100k | R-US_R0805 |
| R12 | 383 | R-US_R0805 |
| R13 | 10k | R-US_R0805 |
| R14 | 100 | R-US_R0805 |
| R15 | 330k | R-US_R0805 |
| R16 | 140 | R-US_R0805 |
| R17 | 100k | R-US_R0805 |
| R18 | 140 | R-US_R0805 |
| R19 | 2.5k | R-US_R0805 |
| R20 | 100k | R-US_R0805 |
| R21 | 10k | R-US_R0805 |
| R22 | 2.5k | R-US_R0805 |
| R23 | 13.3k | R-US_R0805 |
| R24 | 100k | R-US_R0805 |
| R25 | 383 | R-US_R0805 |
| R26 | 10k | R-US_R0805 |
| R27 | 140 | R-US_R0805 |
| R28 | 10k | R-US_R0805 |
| R29 | 140 | R-US_R0805 |
| R30 | 330k | R-US_R0805 |
| R31 | 330k | R-US_R0805 |
| R32 | 140 | R-US_R0805 |
| R33 | 140 | R-US_R0805 |
| R34 | 2.5k | R-US_R0805 |
| R35 | 13.3k | R-US_R0805 |
| T1 | | TESTPADS_.075 × 0.075 × 0.015 |
| T2 | | TESTPAD038 |
| U1 | | PIC16F677-I/SS_20SSOP |
| U2 | | LM339_SOIC14 |
| U3 | | ZXCT1010_SOT23-5 |

Figure 9:
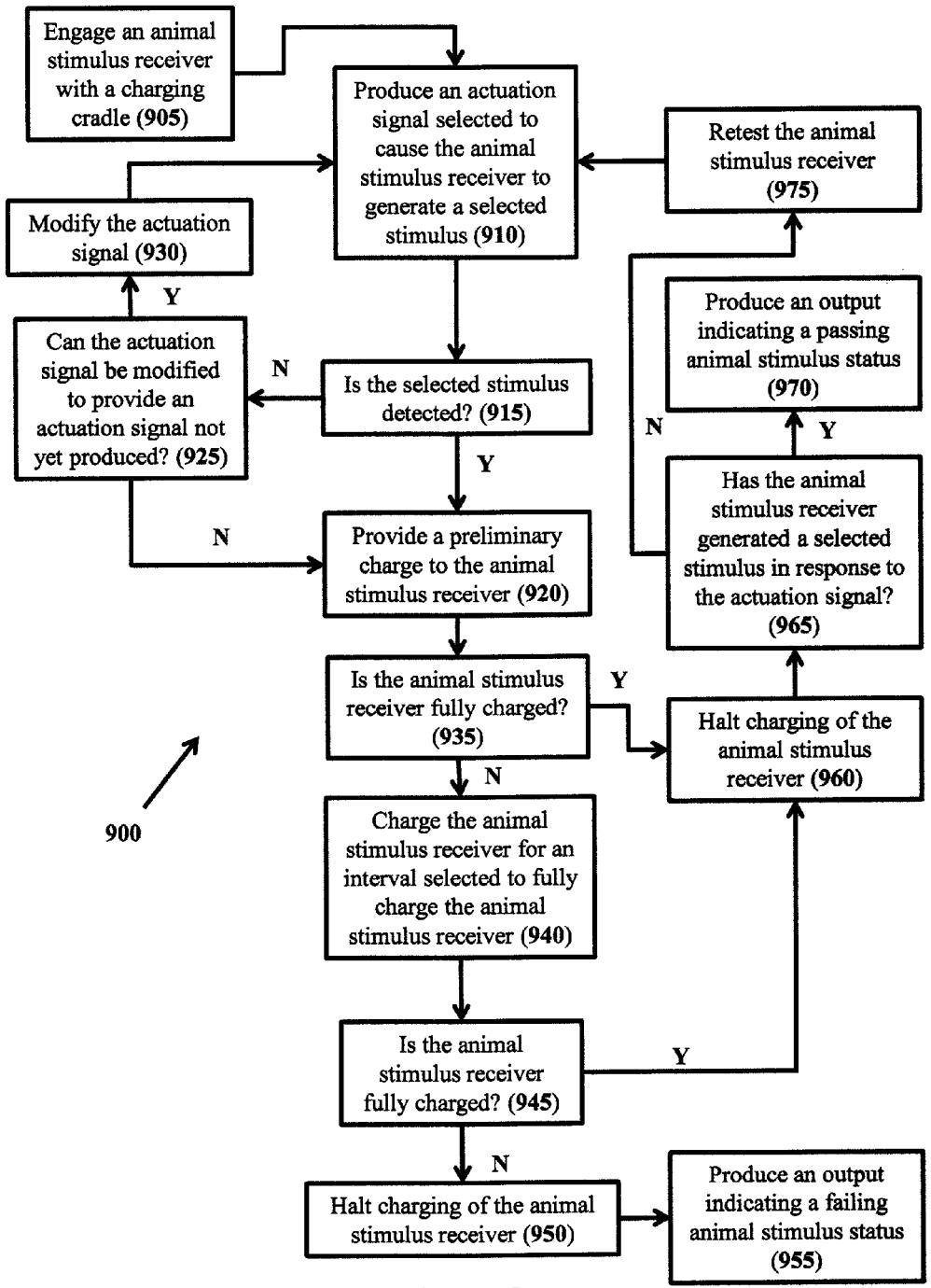
FIG. 9 illustrates a method of the invention that includes both charging and testing an animal stimulus receiver.

The present invention may further include methods of charging and testing an animal stimulus receiver (e.g., animal stimulus receiver 200) with a cradle 100 having stimulus detection circuitry and charging circuitry. As illustrated in FIG. 9, the present invention describes a method 900.

At the outset, an animal stimulus receiver to be charged and tested may be engaged with a charging cradle of the invention (905). After engagement, the charging cradle will activate, thereby activating both the charging circuitry and the stimulus detection circuitry. After activation, the cradle may produce an actuation signal selected to cause the animal stimulus receiver, and more particularly the stimulus generator of the receiver, to generate a selected stimulus (910).

An actuation signal may be selected, and provided to the animal stimulus receiver, to produce at least one of a shock stimulus, a vibrational stimulus, and auditory stimulus. Thus, a specific signal may be selected to produce a corresponding stimulus. Actuation signals of the invention may include radio wave and electromagnetic signals, which may include AM signals. Moreover, such signals may have wave forms that are, for example, rectangular or square shape. The intermittent, or pulsed, signals may also be referred to as having OOK signature, i.e., "on/off keying." Actuation signals of the invention may include an actuation amplitude (i.e., carrier frequency) and an actuation signature. In certain embodiments, the actuation amplitude may be from 1 to 100 kHz. Specifically, the actuation amplitude may be from 5 to 50 kHz. More specifically, the actuation amplitude may be from 5 to 20 kHz. In certain other embodiments, the actuation amplitude may include 7.5, 10.7, or 15 kHz. The actuation signature may be defined as the OOK signature or periods of "on" time (time period of frequency transmission) versus periods of "off" time (time period without frequency transmission). For example, an actuation signal of the invention may have an actuation amplitude of 10 kHz having a 50% duty cycle with an "on" time of 10 ms and an "off" time of 10 ms. Specifically, the actuation signature of the invention may have an "on" time of 0.1 ms to 100 ms and, more specifically, an "on" time of 1 ms to 50 ms. Conversely, the actuation signature of the invention may have an "off" time of 0.1 ms to 100 ms and, more specifically, an "off" time of 1 ms to 50 ms. The "on" time and "off" time may be the same or different. Moreover, the pulses of the signature (i.e., periods of "on" time) may be repeated or, in other embodiments, the signature may include multiple pulses of varying "on" time with varying "off" time between such pulses.

In certain actuation signatures of the invention, an actuation amplitude may (1) be turned on for 5.5 ms, then turned off for a duration of 5.5 ms, with the pattern repeating; (2) be turned on for 15 ms, then turned off for a duration of 15 ms, with the pattern repeating; (3) be turned on for 2.4 ms, then turned off for 1 ms, then turned on for 1 ms, then turned off for 3 ms, then turned on again for 1 ms, then turned off for 24 ms, with the pattern repeating; or (4) be turned on for 1.6 ms, then turned off for 0.8 ms, then turned on again for 0.8 ms, then turned off for 2.2 ms, then turned on again for 0.8 ms, then turned off for 24 ms, with the pattern repeating.

With regard to the actuation signatures (1) and (2), the actuation amplitude may preferably be selected from 7.5, 10.7, or 15 kHz. For actuation signature (3), the actuation amplitude may preferably be 7.5 kHz. For actuation signature (4), the actuation amplitude may preferably be 10.7 kHz. As set forth herein, the animal stimulus receiver may be programmed to provide a specific stimulus (e.g., shock, auditory, vibrational) upon the reception of a selected actuation signal. Additionally, actuation signals (1)-(4) may produce a shock stimulus at the animal control receiver.

After the production of an actuation signal, the stimulus circuitry of the invention will then detect whether a selected stimulus has been produced (915). If the selected stimulus is not detected, it is then determined if the actuation signal may be modified to provide an actuation signal that was not yet produced to determine if a different actuation signal is necessary to produce a selected stimulus at the animal control receiver (925). If the actuation signal can be modified to provide an actuation signal not yet produced, the actuation signal is modified and then produced (steps 930 and 910).

Where the selected stimulus is detected in step 915, or the actuation signal may not be modified (step 925), a preliminary charge is provided to one or more batteries of the animal stimulus receiver (920). The preliminary charge (i.e., voltage) may be applied for a period of about 0.1 to 100 minutes, but preferably about 1 minute. After a preliminary charge, the animal stimulus receiver is tested to determine if it is fully charged (935).

If the animal stimulus receiver is fully charged, charging is halted (960) and the charging circuitry or control processor is queried to determine if the animal stimulus receiver has successfully produced a selected stimulus in response to an actuation signal (965). If so, an output indicator is set to indicate to a user that the animal stimulus receiver is operational (a "passing" status) and ready for use (970). However, if the animal stimulus receiver has not yet generated a selected stimulus, even after being fully charged, the animal stimulus receiver is retested and actuation signals are again produced (steps 975 and 910).

After step 935, if the animal stimulus receiver is not fully charged, the animal stimulus receiver is charged for an interval selected to fully charge the animal stimulus receiver (940). Specifically, one or more batteries of the animal stimulus receiver may be charged for an interval of about 1 minute to 4 hours, but in certain aspects about 2.5 hours.

After step 940, the animal stimulus receiver is again tested to determine if it is fully charged (945). If the animal stimulus receiver is fully charged, charging is halted at step 960, discussed above. However, if the animal stimulus receiver is not fully charged, charging is halted (950) and an output indicator is set to indicate to a user that the animal stimulus receiver is not operational (a "failing" status) and not ready for use (955).

Additionally, where the animal stimulus receiver is subjected to retesting at step 975 for failing to produce a selected stimulus, the animal stimulus receiver may be subsequently retested multiple times. However, in certain aspects of the methods of the invention, the animal stimulus receiver may be retested once and, if again failing to produce a selected stimulus at step 925, the method will proceed to step 955 and an output indicator will be set to indicate a failing status.

Figure 10A:
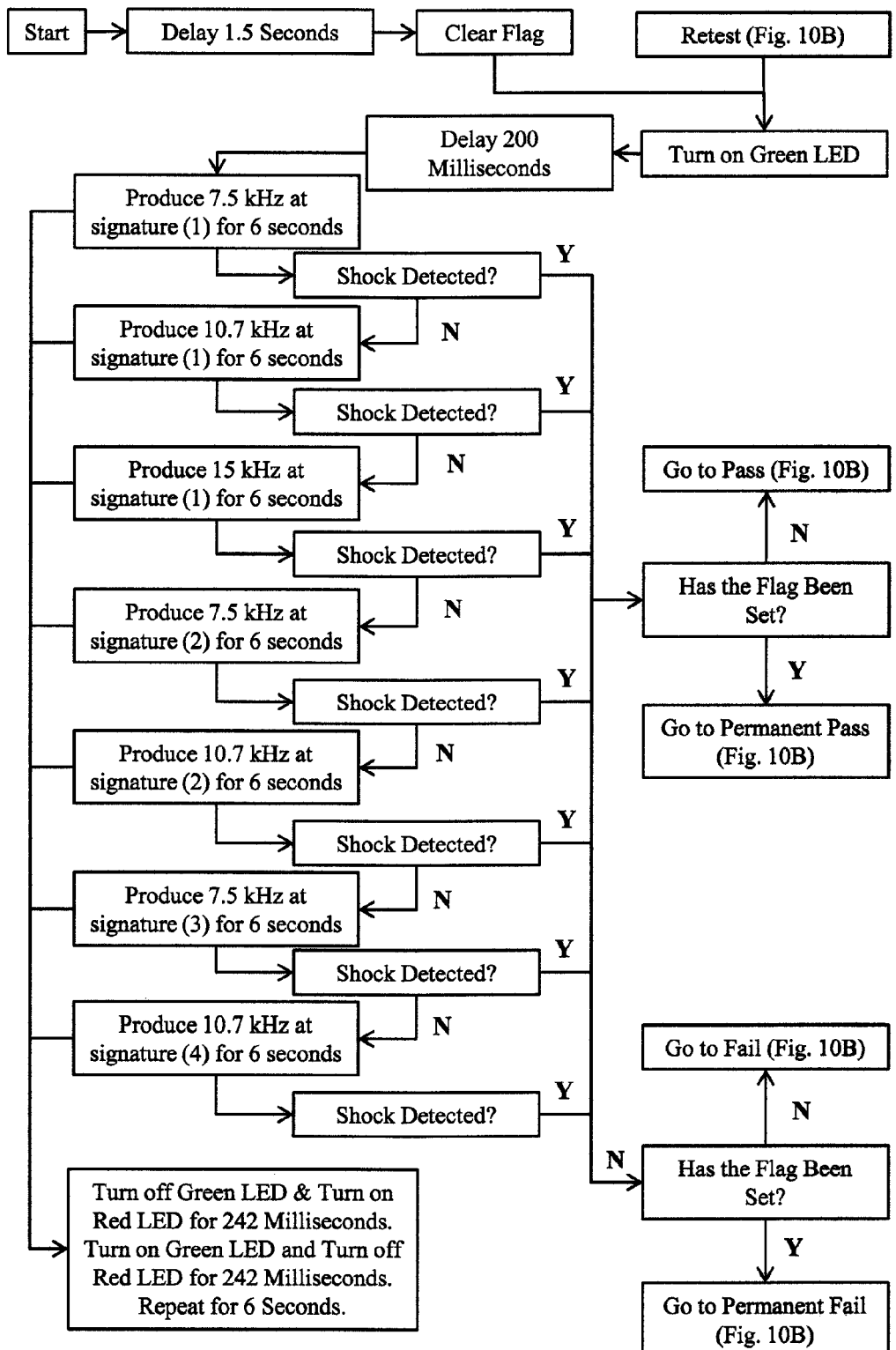
FIGS. 10A and 10B illustrate an exemplary method of the invention that provides seven different actuation signals at an animal stimulus receiver and charges the animal stimulus receiver.
Figure 10B:
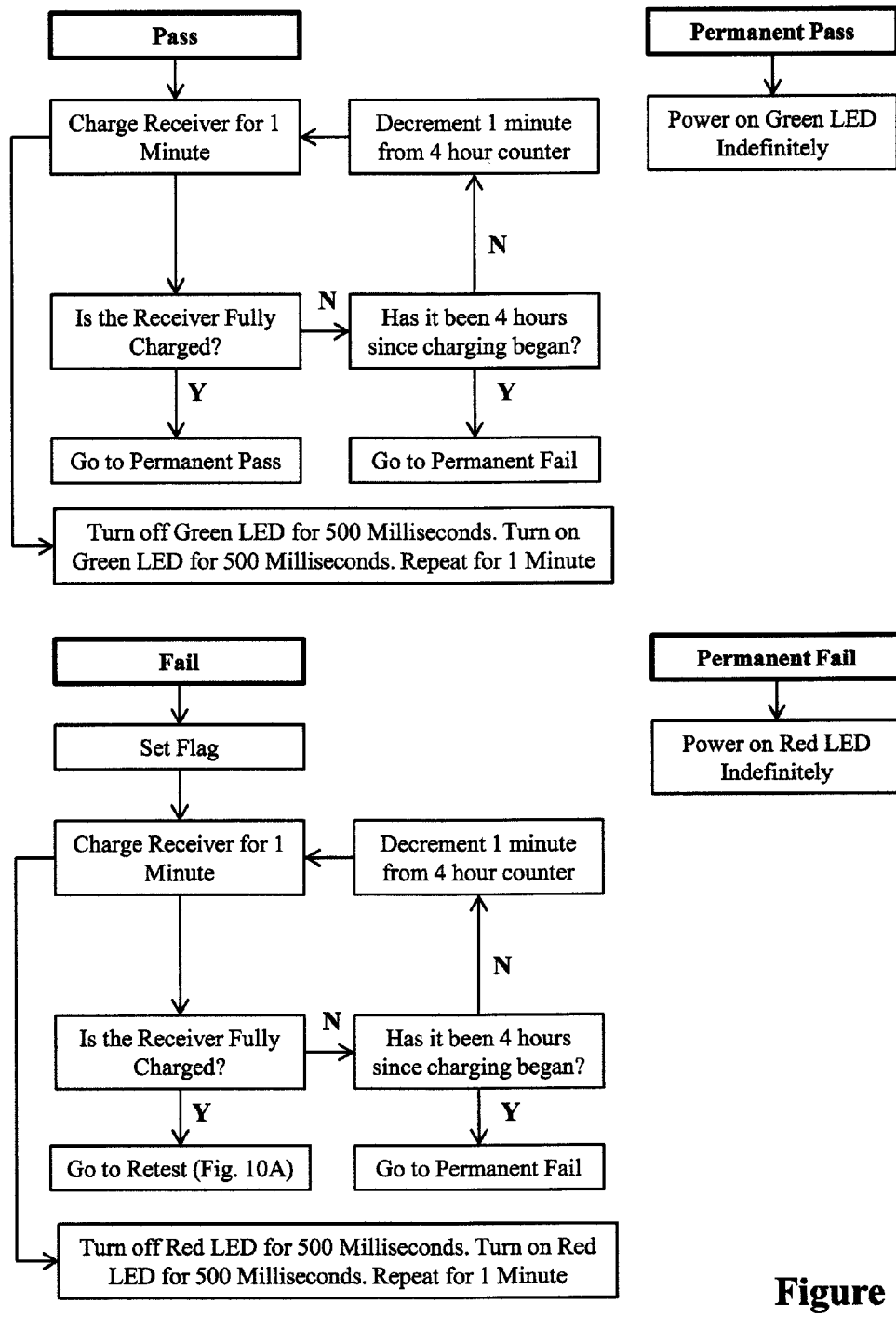

An exemplary method of the invention, which utilizes actuation signals having actuation amplitudes of 7.5 kHz, 10.7 kHz, and 15 kHz with actuation signals that include signatures (1)-(4), is provided in FIGS. 10A-10B. Moreover, the exemplary method of FIGS. 10A-10B may be employed with cradle 100.

While certain embodiments of the present invention have been described and/or exemplified above, various other embodiments will be apparent to those skilled in the art from the foregoing disclosure. The present invention is, therefore, not limited to the particular embodiments described and/or exemplified, but is capable of considerable variation and modification without departure from the scope and spirit of the appended claims.

The methods of the invention can be embodied as a computer implemented process or processes and/or apparatus for performing such computer-implemented process or processes, and can also be embodied in the form of a tangible storage medium containing a computer program or other machine-readable instructions (herein "computer program"), wherein when the computer program is loaded into a computer or other processor (herein "computer") and/or is executed by the computer, the computer becomes an apparatus for practicing the process or processes. Storage media for containing such computer program include, for example, floppy disks and diskettes, compact disk (CD)-ROMs (whether or not writeable), DVD digital disks, RAM and ROM memories, computer hard drives and back-up drives, external hard drives, "thumb" drives, and any other storage medium readable by a computer. The process or processes can also be embodied in the form of a computer program, for example, whether stored in a storage medium or transmitted over a transmission medium such as electrical conductors, fiber optics or other light conductors, or by electromagnetic radiation, wherein when the computer program is loaded into a computer and/or is executed by the computer, the computer becomes an apparatus for practicing the process or processes. The process or processes may be implemented on a general purpose microprocessor or on a digital processor specifically configured to practice the process or processes. When a general-purpose microprocessor is employed, the computer program code configures the circuitry of the microprocessor to create specific logic circuit arrangements. Storage medium readable by a computer includes medium being readable by a computer per se or by another machine that reads the computer instructions for providing those instructions to a computer for controlling its operation. Such machines may include, for example, a punched card reader, a magnetic tape reader, a magnetic card reader, a memory card reader, an optical scanner, as well as machines for reading the storage media mentioned above.

Furthermore, the transitional terms "comprising", "consisting essentially of" and "consisting of", when used in the appended claims, in original and amended form, define the claim scope with respect to what unrecited additional claim elements or steps, if any, are excluded from the scope of the claim(s). The term "comprising" is intended to be inclusive or open-ended and does not exclude any additional, unrecited element, method, step or material. The term "consisting of" excludes any element, step or material other than those specified in the claim and, in the latter instance, impurities ordinary associated with the specified material(s). The term "consisting essentially of" limits the scope of a claim to the specified elements, steps or material(s) and those that do not materially affect the basic and novel characteristic(s) of the claimed invention. All devices and methods described herein that embody the present invention can, in alternate embodiments, be more specifically defined by any of the transitional terms "comprising," "consisting essentially of," and "consisting of."

What is claimed is:

1. A charger for charging and testing an animal stimulus receiver, wherein the animal stimulus receiver comprises a stimulus generator adapted to deliver a stimulus to an animal, the charger comprising:
   a. a power supply connector configured to communicate with a power supply;
   b. charging circuitry in communication with the power supply connector that is configured to apply a charging voltage to the animal stimulus receiver; and
   c. stimulus detection circuitry configured to receive a stimulus from the animal stimulus receiver and determine a stimulus status of the animal stimulus receiver.

2. The charger of claim 1, wherein the stimulus detection circuitry comprises shock detection circuitry configured to receive a shock stimulus from the animal stimulus receiver.

3. The charger of claim 1, comprising an auditory stimulus detector configured to detect an auditory stimulus of the animal stimulus receiver.

4. The charger of claim 1, comprising an animal receiver fault detector configured to determine a fault status of the animal stimulus receiver, wherein the fault status comprises a short circuit fault status, a wire corrosion fault status, or a combination thereof.

5. The charger of claim 1, wherein the charging circuitry is configured to detect a battery charge status of at least one battery of the animal stimulus receiver.

6. The charger of claim 1, comprising an output indicator configured to indicate an output of the charger, the output comprising a battery charge status, a fault status, or the stimulus status of the animal stimulus receiver.

7. The charger of claim 6, wherein the output indicator is in communication with at least one of the charging circuitry and the stimulus detection circuitry, the output indicator configured to display at least one of the battery charge status and stimulus status.

8. The charger of claim 6, wherein the battery charge status is at least one of a charge in process status, a battery fault status, and a battery charge complete status.

9. The charger of claim 1, comprising a receiver stimulus actuator configured to provide an actuation signal adapted to cause the animal stimulus receiver to generate the stimulus.

10. The charger of claim 9, wherein the stimulus comprises at least one of a shock stimulus, auditory stimulus, and a vibrational stimulus.

11. The charger of claim 9, wherein the receiver stimulus actuator comprises at least one of a magnetic field transmitter and a radio wave transmitter.

12. The charger of claim 9, wherein the actuation signal comprises an actuation signature and an actuation amplitude.

13. The charger of claim 1, wherein the stimulus detection circuitry comprises shock detection circuitry.

14. The charger of claim 13, wherein the shock detection circuitry comprises level detection circuitry configured to determine whether the shock stimulus includes a level of shock indicative of normal operation.

15. The charger of claim 13, wherein the shock detection circuitry comprises voltage measuring circuitry configured to verify that the shock stimulus was produced.

16. The charger of claim 15, wherein the voltage measuring circuitry is configured to apply a load to a stimulus prong of the animal stimulus receiver, the load indicative of a load provided by animal flesh.

17. The charger of claim 1, comprising a voltage supply circuit configured to activate at least one of the charging circuitry and the shock detection circuitry when the animal stimulus receiver is placed in communication with the voltage supply circuit.

18. The charger of claim 17, wherein the voltage supply circuit comprises a time delay circuit.

19. The charger of claim 1, comprising a control processor in communication with at least one of the charging circuitry and stimulus detection circuitry, the control processor configured to monitor an output from the charging circuitry, stimulus detection circuitry, or a combination thereof.

20. A method for charging and testing an animal stimulus receiver with a charger having charging circuitry and stimulus detection circuitry, the method comprising the steps of:
   a. activating at least one of the charging circuitry and stimulus detection circuitry;
   b. applying an actuation signal to the animal stimulus receiver, the actuation signal selected to cause the animal stimulus receiver to generate a selected stimulus at the stimulus detection circuitry;
   c. detecting whether the selected stimulus was generated at the stimulus detection circuitry; and
   d. charging a battery of the animal stimulus receiver with the charging circuitry for a selected period of time.

21. The method of claim 20, comprising the step of removably connecting the animal stimulus receiver to the charger.

22. The method of claim 20, wherein the step of applying the actuation signal comprises applying a shock stimulus actuation signal, an auditory stimulus actuation signal, a vibrational actuation signal, or a combination thereof.

23. The method of claim 20, wherein the step of detecting the selected stimulus comprises detecting a shock stimulus, an auditory stimulus, a vibrational stimulus, or a combination thereof.

24. The method of claim 20, comprising the step of modifying the actuation signal where the selected stimulus was not generated at the stimulus detection circuitry to provide a modified actuation signal.

25. The method of claim 24, comprising applying the modified actuation signal to the animal stimulus receiver, the modified actuation signal selected to cause the animal stimulus receiver to generate a modified selected stimulus at the stimulus detection circuitry.

26. The method of claim 24, wherein the step of modifying the actuation signal comprises modifying at least one of an actuation signature and an actuation amplitude.

27. The method of claim 20, wherein the step of charging the battery of the animal stimulus receiver comprises applying a preliminary charge to the animal stimulus receiver.

28. The method of claim 20, comprising detecting whether the battery of the animal stimulus receiver is fully charged.

29. The method of claim 20, wherein the step of charging the battery of the animal stimulus receiver comprises charging the battery for an interval selected to fully charge the battery of the animal stimulus receiver.

30. The method of claim 20, comprising the step of producing a fault status of the animal stimulus receiver at an animal receiver fault detector, the fault status comprising a short circuit fault status, a wire corrosion fault status, or a combination thereof.

31. The method of claim 20, comprising the step of detecting a battery charge status of the battery of the animal stimulus receiver, the battery charge status comprising at least one of a charge in process status, a battery fault status, and a battery charge complete status.

* * * * *